United States Patent
Daniels et al.

(10) Patent No.: US 7,859,442 B2
(45) Date of Patent: *Dec. 28, 2010

(54) ASYNCHRONOUS SIGMA DELTA ANALOG TO DIGITAL CONVERTER USING A TIME TO DIGITAL CONVERTER

(76) Inventors: Jorg Daniels, Strijdersstraat 46, Leuven (BE) 3000; Wim Dehaene, Gemeentestraat 201, Kessel-Lo (BE) 3010; Andreas Wiesbauer, Saliacherstr. 85, A-9210 Portschach (AT)

(*) Notice: Subject to any disclaimer, the term of this patent is extended or adjusted under 35 U.S.C. 154(b) by 36 days.

This patent is subject to a terminal disclaimer.

(21) Appl. No.: 12/245,221

(22) Filed: Oct. 3, 2008

(65) Prior Publication Data

US 2009/0091485 A1    Apr. 9, 2009

Related U.S. Application Data

(60) Provisional application No. 60/977,880, filed on Oct. 5, 2007.

(51) Int. Cl.
*H03M 3/00*    (2006.01)

(52) U.S. Cl. .................................... 341/143; 375/261
(58) Field of Classification Search .......... 341/143–155
See application file for complete search history.

(56) References Cited

U.S. PATENT DOCUMENTS

| 5,471,209 | A  | * | 11/1995 | Sutterlin et al. | 341/143 |
|-----------|----|---|---------|------------------|---------|
| 5,838,272 | A  | * | 11/1998 | Steiner et al.   | 341/143 |
| 5,959,562 | A  | * | 9/1999  | Wiesbauer        | 341/143 |
| 6,008,703 | A  | * | 12/1999 | Perrott et al.   | 332/100 |
| 6,016,112 | A  | * | 1/2000  | Knudsen          | 341/118 |
| 6,369,730 | B1 | * | 4/2002  | Blanken et al.   | 341/143 |
| 6,414,613 | B1 | * | 7/2002  | Midya et al.     | 341/143 |
| 6,741,197 | B1 | * | 5/2004  | Melanson         | 341/150 |
| 6,839,387 | B1 | * | 1/2005  | Mittel           | 375/247 |
| 7,006,762 | B2 | * | 2/2006  | Baskin           | 388/829 |
| 7,298,310 | B2 | * | 11/2007 | Tsividis         | 341/159 |
| 7,629,916 | B2 | * | 12/2009 | Wiesbauer et al. | 341/166 |
| 2009/0091486 | A1 | * | 4/2009 | Wiesbauer et al. | 341/143 |

* cited by examiner

*Primary Examiner*—Lam T Mai
(74) *Attorney, Agent, or Firm*—Lee & Hayes, PLLC (57) ABSTRACT

This disclosure relates to analog to digital conversion using irregular sampling.

13 Claims, 11 Drawing Sheets

ASYNCHRONOUS SIGMA DELTA ANALOG TO DIGITAL CONVERTER USING A TIME TO DIGITAL CONVERTER

RELATED APPLICATIONS

The present application claims priority under 35 U.S.C. §119(e) to U.S. Provisional Application No. 60/977,910, filed Oct. 5, 2007, the disclosure of which is incorporated herein.

BACKGROUND

It is a goal of electronic designers to design circuits that utilize a low supply voltage and consume low power. This is the case for Analog to Digital Converters (ADC), and particularly sample and hold circuits used in analog to digital conversion which typically require very high sampling frequency to achieve good performance and accuracy; however, a high sampling frequency requirement typically results in high power consumption.

Figure 1:
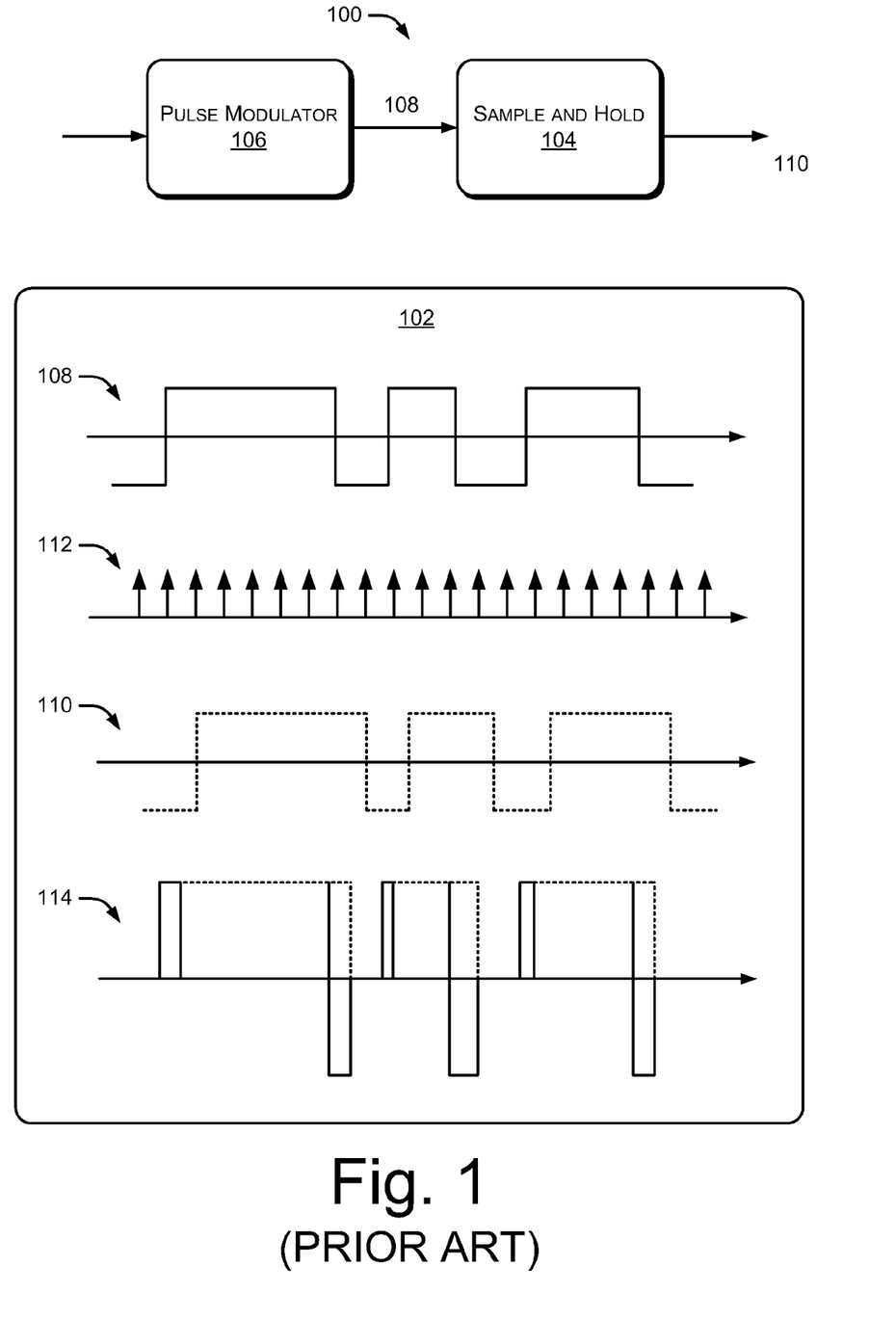
FIG. 1 illustrates a typical Analog to Digital Converter (ADC) and associated timing diagrams.

FIG. 1 is a typical ADC 100 and a representative timing diagram 102. ADC 100 includes a traditional sample and hold circuit or SnH circuit 104. A pulse modulator 106 converts amplitude information of an input analog signal into time information by duty cycle modulation. The timing diagram 102 shows a pulse-modulated signal 108, which is generated by the pulse modulator 106, and received by the SnH circuit 104. The SnH circuit 104 samples the output of the pulse modulator 106 at discrete intervals of time (where the interval may be represented by $F_S$) using an equidistant sampling clock. The output of the SnH circuit 104 is represented as sampled modulated signal 110. Pulses generated by the equidistant sampling clock are represented by signal 112.

Equidistant sampling can result in a duty cycle modulated square wave 110 with synchronous leading and trailing edges, similar to the modulated signal 108. The difference between the edge positions of the modulated signal 108 and the sampled signal 110 is an introduced quantization noise as represented by signal 114.

Various known techniques may reduce the quantization noise depicted in signal 114. Such techniques include applying higher clock frequencies that use a polyphase sampler and polyphase filters instead of the SnH 104 circuit. However, these techniques are usually complex, and inefficient in reducing the high sampling clock required for sampling the analog signal. Therefore, such known techniques still may require a high supply voltage, and consume relatively more power.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Discussed are techniques for irregular sampling and quantization of an analog signal and a demodulation technique to reconstruct an original signal. Such techniques can be implemented through an irregular sampler and a quantizer, where the irregular sampler uses irregular intervals to sample signals (i.e., a non-equidistant sample value). The irregular sampler and the quantizer can be implemented in a variety of electronic systems such as audio systems, TV tuner cards, etc. For example, the irregular sampler and quantizer can be implemented in Analog to Digital converters (ADC) used in wireless communication systems, mobile communication systems, Direct Current to Direct Current (DC-DC) converters, microphones, etc.

Together, the irregular sampler and quantizer convert a continuous time analog signal into a discrete time digital signal. The sampler can sample a continuous signal at discrete intervals of time to convert the continuous signal into a discrete signal. Sampling may be performed at a frequency that is at least two times the highest frequency of the continuous signal being sampled. The quantizer approximates a continuous range of the sampled values based on a relatively small set of discrete symbols or integer values. Since the quantizer uses a small set of discrete symbols or integer values to represent the signal, the quantizer may introduce a quantization noise or error. For example, if an input analog signal at one instant of time has a specific value of 8.2367 volts, the quantizer may approximate the sample value of the input analog signal at a value of 8 or 8.25 volts. In such a case, the difference between an approximated quantized signal and the actual input analog signal is the quantization noise.

The disclosed irregular sampler and quantizer convert an input analog signal into a corresponding digital signal using time-discrete irregular sampling values of the input signal. The amplitude of the input signal is first converted into time information of a square wave by a modulator. The time signal is digitized by a timing unit that samples the continuous time signal at non-equidistant discrete times and generates irregular sampling values. The sampling values can be quantized, and the original signal can then be reconstructed in digital form by a demodulator.

For example, the use of such irregular sampling and quantization techniques implemented in an ADC can lead to results that are more accurate and allow the ADC to function at a lower clock frequency, thereby utilizing relatively lower supply voltages and power consumption.

In an implementation, the ADC can be extended with a feedback loop for shaping the quantization noise of the irregular sampler. This can provide a decrease in in-band distortion generated during the irregular sampling and quantization and can lead to greater accuracy.

Figure 2:
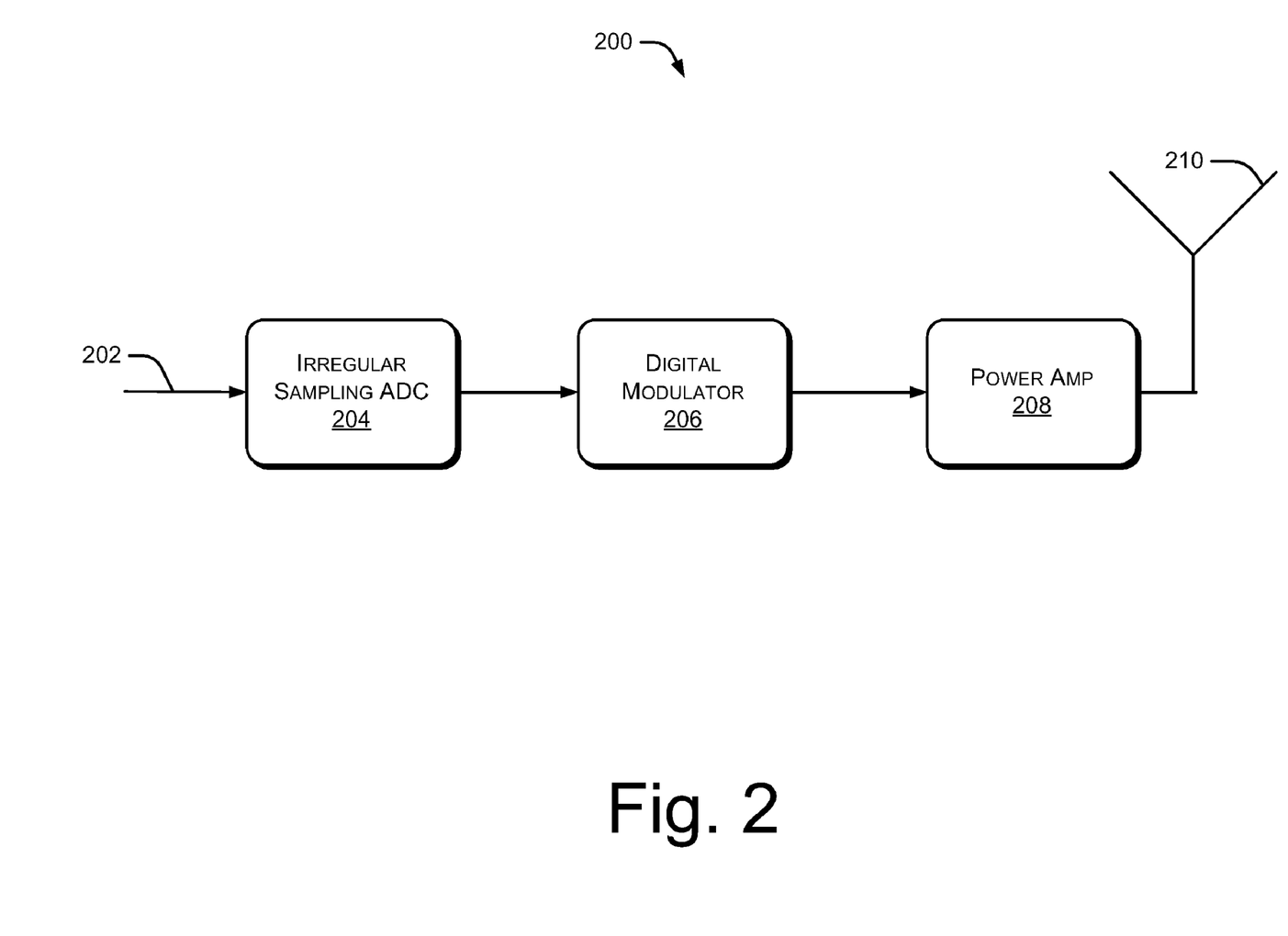
FIG. 2 illustrates an exemplary system for implementing an Analog to Digital Converter (ADC) using irregular sampling.

FIG. 2 is an exemplary system 200 that employs an irregular sampler and a quantizer implemented in an Analog to Digital Converter. For example, the system 200 can be a wireless communication system performing analog to digital conversion and transmitting a digital signal. It is to be understood that the system 200 may also be implemented as or part of another system such as a TV tuner card, mobile communications systems, Bluetooth transmission systems, Very high speed Digital Subscriber Line (VDSL) systems, and so on.

The system 200 receives analog input signals 202 from an analog source, and includes an irregular sampling ADC 204 and a digital modulator 206 to generate a modulated digital signal. The modulated signal can drive a power amplifier 208. System 200 includes an antenna 210 to transmit the power-amplified signal.

As an example, analog input signals 202 can include voice signals or data signals, and/or a combination of the two. In case of a voice signal, the analog source can be a microphone. If the signal is a data signal, then the analog input signals 202 can be video transmission signals, and the like.

The irregular sampling ADC 204 converts the analog signal into a digital signal. The irregular sampling ADC 204 first modulates the analog signal by converting amplitude information of the analog signal into continuous time information of the modulated analog signal. The modulated analog signal is sampled at irregular intervals by the irregular sampling ADC 204. These irregular samples can be quantized and demodulated to reconstruct the original signal in digital form. In a particular implementation, noise shaping can also be introduced in the irregular sampling ADC 204 to reduce quantization noise present in the reconstructed digital signal at in-band frequencies. The working of the irregular sampling ADC 204 is described in further detail below with reference to FIGS. 3-6.

The digital modulator 206 modulates the digital output of the irregular sampling ADC 204. The digital modulator 206 can up-sample the frequency of the signal or introduce a carrier for broadband transmission. In cases where the system is utilized for base-band transmission, the digital modulator 206 may be eliminated. In certain implementations, the digital modulator 206 may include various signal-processing components, such as digital filters, up samplers, and noise shapers.

The power amplifier 208 amplifies and increases the power efficiency of the modulated signal received from the digital modulator 206. As an example, the power amplifier 208 can be a class C or D non-linear amplifier working in a saturated mode close to cut-off. The amplified signal from the power amplifier 208 may be transmitted via the antenna 210.

Figure 3:
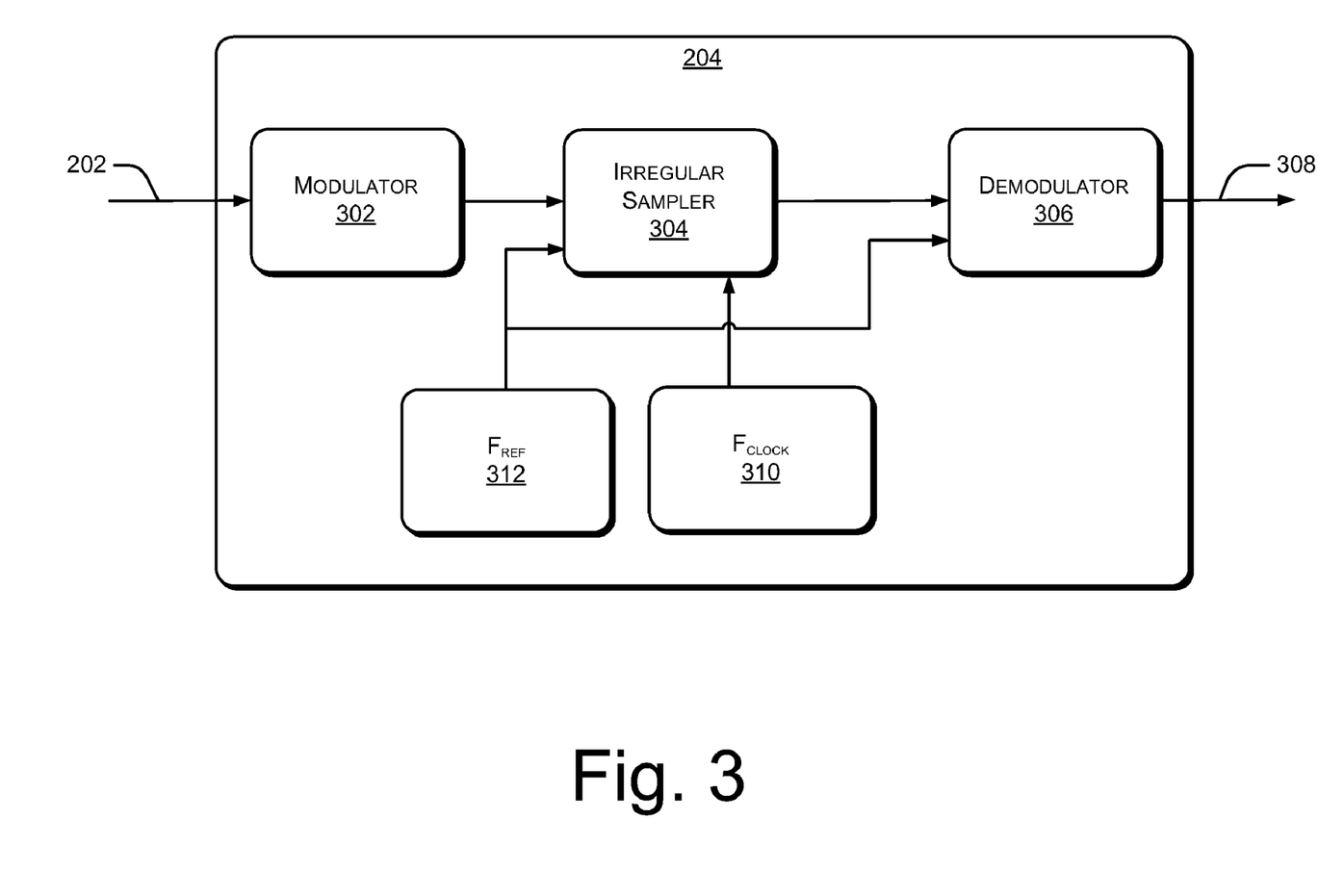
FIG. 3 illustrates an Analog to Digital Converter (ADC) for implementing analog to digital conversion using irregular sampling.

FIG. 3 illustrates an exemplary irregular sampling ADC 204. The ADC 204 includes a modulator 302, an irregular sampler 304, and a demodulator 306. The modulator 302 can modulate the analog input signal 202. The modulator 302 may convert the amplitude information of the analog input signal 202 into time information in time domain. Such modulation may commonly be referred to as pulse or duty cycle modulation. The modulator 302 may generate a square wave with varying duty cycle in accordance with the amplitude of the analog input signal 202. For low amplitudes of the input analog signal 202, the duty cycle of the output square wave may be low and vice versa.

In an implementation, the modulator 302 may be an Asynchronous Delta Sigma Modulator (ADSM). The ADSM generates an asynchronous square wave with a duty cycle, which is approximately linearly dependent on the analog input signal 202. In addition, the ADSM can generate an instantaneous frequency, which is non-linearly dependent on the analog input signal 202. The ADSM can be implemented without any clock and can be operated at low currents and supply voltages. Further, since the ADSM is asynchronous, the output of the ADSM would contain no quantization error. Therefore, the output of the ADSM is a direct representation of the analog input signal 202. An exemplary ADSM is further discussed in detail below in reference to FIG. 5.

The modulated signal from the modulator 302, such as the ADSM, is sampled by the irregular sampler 304. The irregular sampler 304 digitally measures the edges of the modulated signal (which is a square wave), and generates a sample each time a data transition edge in the square wave is detected. In an implementation, a Time to Digital Converter (TDC) can be used as the irregular sampler 304.

The irregular sampler 304 samples the modulated signal at irregular intervals. In the other words, the irregular sampler 304 samples or measures at non-equidistant sample values. Irregular sampler 304 uses a measuring clock $F_{clock}$ 310 that measures the time information of the modulated signal and converts the time information into discrete digital information. In effect, the irregular sampler 304 operates as an ultra high-speed sampler that samples the input signal during data transition. Therefore, irregular sampler 304 can provide high precision sampling at a relatively low clock rate, which reduces activity of the irregular sampler 304 and reduces the power consumption.

In this example, the irregular sampler 304 uses a reference clock $F_{ref}$ 312 that allows for equidistant sampling or regular sampling of the modulated signal. In such a case, the modulated signal may be measured at the rising edge of each clock pulse of the $F_{ref}$ 312, thereby producing equidistant samples. In an implementation, the frequency of the reference clock $F_{ref}$ 312 is set to at least the limit cycle frequency of the modulated signal to avoid loss of information. The limit cycle frequency is the oscillation frequency of the modulated square wave.

The irregular sampler 304 may also be used for quantization of the sampled signal (i.e., modulated signal). The irregular sampler 304 may quantize the sampled signal into discrete integer values or symbols. Any suitable number of binary bits may be employed to quantize the signal. For larger bit numbers, the number of levels that the sampled signal may be quantized into is larger. Therefore, the quantization noise is lower.

In certain implementations, a dither may be added to the irregular sampler 304 before quantization of the sampled modulated signal. Dither is an intentionally applied form of noise, used to randomize quantization error, thereby preventing large-scale patterns such as contouring. Dither may be added before any quantization or re-quantization process, in order to prevent non-linear behavior (i.e., distortion). The lesser the bit depth, the greater the dither may be. The results of the dithering process may still yield distortion; however, the distortion may be of a random nature, such that distortion may be effectively filtered. Examples of dithers that may be used include rectangle probability density function, triangular probability density function, Gaussian PDF, etc.

The irregular sampler 304 may be designed with digital components, such as inverters and latches, which work at higher speeds and consume lower amounts of power as compared to analog components. The irregular sampler 304 is further discussed in detail below.

The output of the irregular sampler 304 is a sampled digital signal measured at the edges of the modulated signal. The demodulator 306 generates a digital representation of the analog input signal 202 from the sampled digital signal. The demodulator 306 may construct a digital signal 308 (reconstructed digital signal) using a digital demodulation technique by transforming the time information received from the irregular sampler 304 back into amplitude information in digital form.

The demodulator 306 reconstructs the original signal in digital domain without ultra high-speed down sampling operations by demodulating the signal instead of filtering it. The demodulation is based on the general duty cycle modulation theory, and therefore may be used instead of an ultra-high speed down sampler, thereby increasing power efficiency. The demodulation technique used by the demodulator 306 is discussed in further detail below.

Figure 4:
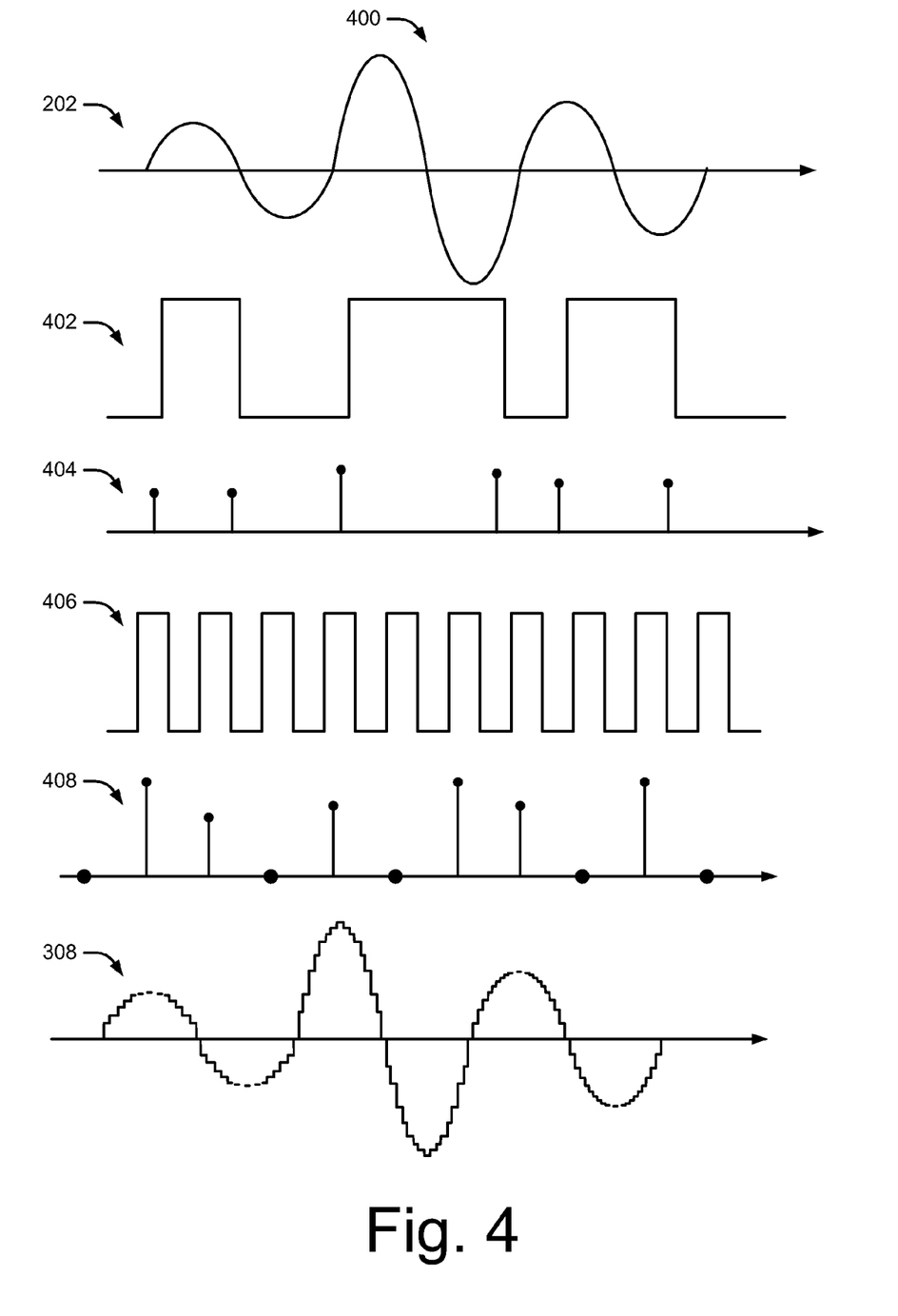
FIG. 4 illustrates a timing diagram of an ADC used for implementing analog to digital conversion using irregular sampling.

FIG. 4 illustrates an exemplary timing diagram 400 of the ADC 204 illustrated in FIG. 3. The timing diagram 400 includes plots of the analog input signal 202, a modulated signal 402, an irregularly sampled signal 404, clock output 406 of the reference clock$_{Fref}$ 312, an equidistant sampled signal 408, and the reconstructed digital signal 308.

The input signal 202 in the timing diagram 400 is illustrated as a sinusoidal signal having a variable amplitude. This input signal 202 is fed to the modulator 302 and the output of the modulator 302 is the modulated signal 402. As seen in the modulated signal 402, the pulses and duty cycle of the square wave vary in accordance with the amplitude of the analog input signal 202. For lower amplitude signals of the analog input signal 202, the modulated signal 402 has a smaller pulse width and lower duty cycle. In contrast, for higher amplitude signals of the analog input signal 202, the generated output pulse is wider and the modulated signal 402 may have a higher duty cycle.

The irregularly sampled signal 404 illustrates samples generated at the exact location of the data edges of the modulated signal 402. The samples are therefore irregular and not equidistant in time. In other words, whenever data edges are detected, samples are generated at that instant in time.

In an implementation, the irregular sampler 304 may also generate regular samples using the clock output 406 of the reference clock $F_{ref}$ 312. For regular sampling, both the rising and the falling data edges of the modulated signal 402 are measured relative to the rising clock edges of 406. For example, the $F_{ref}$ 312 may be set to 4 times the highest frequency of the input analog signal 202. The irregular sampler 304 may thus generate a regular equidistant sampled signal 408.

The irregularly sampled signal 404 or the equidistant sampled signal 408 is received by the demodulator 306, resulting in the reconstructed digital signal 308. The reconstructed digital signal 308 is a representation of the analog input signal 202 in digital form.

Asynchronous Delta Sigma Modulator

Figure 5:
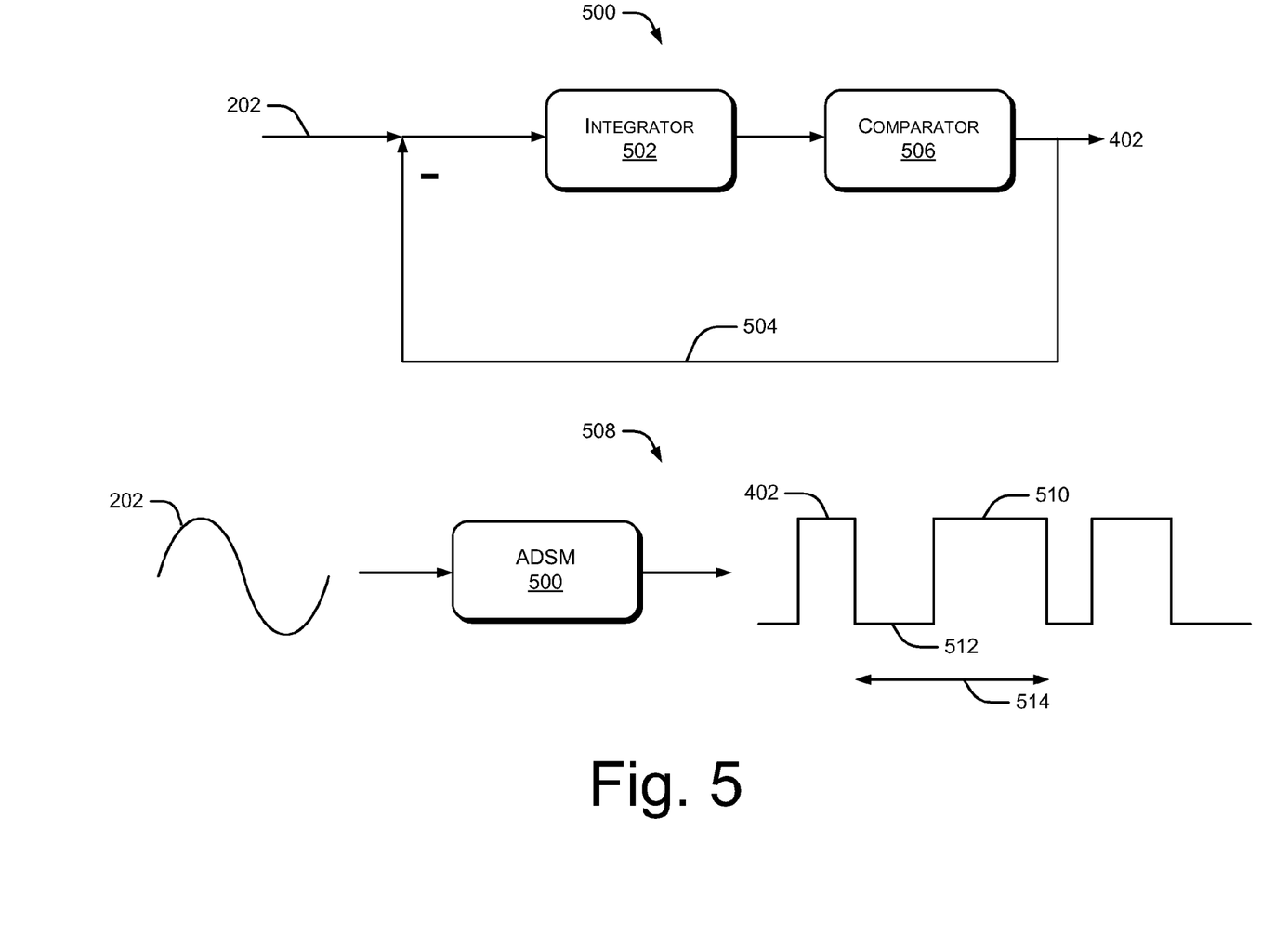
FIG. 5 illustrates an Asynchronous Delta Sigma Modulator (ADSM) for implementing analog to digital conversion using irregular sampling.

FIG. 5 is an exemplary Asynchronous Delta Sigma Modulator (ADSM) 500 used to implement the modulator 302.

The ADSM 500 modulates the signal 202 to the continuous time asynchronous square wave signal 402 through duty cycle modulation according to the following equations:

$$\frac{\alpha(t)}{T(t)} = \frac{v(t)+1}{2} \quad (1)$$

and $$\frac{\omega(t)}{\omega_c} = 1 - v^2(t) \text{ with} \quad (2)$$

$$\omega(t) = \frac{2\pi}{T(t)} \text{ and } |v(t)| < 1 \text{ while, } \alpha(t) + \beta(t) = T(t).$$

Where $\alpha(t)$ is the pulse width, $\beta(t)$ is the pulse distance and $T(t)$ the pulse period and $\omega_c = 2\pi f_c$ is the limit or critical frequency. The duty cycle of the square wave may be $\alpha(t)/T(t)$. The limit frequency is the oscillation frequency of the square wave. The limit frequency is also the highest pulse rate of the square wave.

The ADSM 500 includes an integrator 502, a feedback signal 504, and a comparator 506. The integrator 502 generates a ramp voltage by integrating an input voltage signal over time. The output voltage of the integrator 502 increases continuously while the amplitude of the input signal increases and then decreases abruptly as the amplitude of the signal decreases.

In an implementation, the integrator 502 continuously integrates the difference between the input analog signal 202 and the feedback signal 504 received through the feedback loop. The output signal from the integrator 502 is received by the comparator 506. In general, a comparator, such as the comparator 506, compares two input voltages or currents and switches its output to indicate which of the two inputs is larger. A comparator may also be used to refer to a device that compares two items of data. In this example, one of the voltages received by the comparator 506 may be a reference voltage. The ramp signal received from the integrator 502 may be compared with the reference voltage. The reference voltage may be a pre-defined value.

In one embodiment, the output signal from the comparator 506 may switch from low to high if the integrator output rises above the reference voltage. In an alternate embodiment, the output signal from the comparator 506 may switch from high to low if the output from the integrator 502 drops below the reference voltage or remains unchanged. The output of the comparator 506 is a square wave, such as the modulated signal 402. The integrator 502 and the comparator 506 together convert the amplitude information of an input signal into time information.

The ADSM 500 may be of first order with the integrator 502 having unit gain frequency $f_{int}$ followed by the comparator 506 with hysteresis h. In such a case, the limit cycle frequency or $f_c$ may defined as:

$$f_c = \frac{\pi}{2h} f_{int} \quad (3)$$

Linearity of the ADSM 500 depends on both the limit cycle frequency $f_c$ and Modulation Depth or MD. In general, the MD may indicate the strength of the modulation. The MD indicates how much the modulated variable varies about its original value. If the information in the analog input signal 202 is encoded without any losses in the transition timings of the output of the comparator 506, the ADSM 500 may require no over sampling. In other cases, over sampling may be introduced to increase the signal to noise ratio (SNR). For example, in one implementation, upon doubling the value of the limit cycle frequency of the ADSM, an improvement of −12.04 dB may be obtained.

The conversion of the analog input signal 202 into the modulated signal 402 by the ADSM 500 is depicted in the graphical representation 508. The output of the ADSM 500 is the modulated signal 402 with variations in pulse width ($\alpha(t)$) 510, pulse distance ($\beta(t)$) 512 and pulse period ($T(t)$) 514. These variations are generated in accordance with the amplitude of the input signal 202. The output 402 of the ADSM 500 is thus discrete in amplitude but continuous in time.

Time to Digital Converter

The irregular sampler 304 may be implemented by a Time to Digital Converter (TDC). Typically, TDCs are implemented in applications that use a single time measurement of one of several parallel pulses with a common start position, but with variable lengths. The time measurement may be done by sampling an input signal with multiple phases of a reference clock followed by an edge detector that may determine which phase passes closest to the data edge. Often, the resolution of the measurement may further be refined by using an interpolator. Fine resolutions in the order of tens of picoseconds may be obtained with low clock frequencies.

However, the irregular sampler 304 measures a continuous stream of short pulses at a high rate. Towards this end, the TDC implementing the irregular sampler 304 uses the measurement clock $F_{clock}$ 310 at a frequency that is at least equal to the limit cycle frequency of the modulated signal 402. The samples generated are irregular and indicate the exact location of data transition in the modulated signal. Furthermore, the output of the TDC may be read before the next data edge arrives.

In an implementation, the TDC may sample the modulated continuous time signal 402 as well as quantize the sampled signal 404. For this, the TDC approximates the sampled signal 404 based on discrete values to generate a quantized signal that may be converted into the digital signal 308.

Demodulation

Once the irregular sampler 304 samples and quantizes the modulated signal 402, the operations that follow are purely digital. The output 404 of the irregular sampler 304 provides information regarding the input signal 202 in the measured edge positions of the square wave. The input signal 202 may be reconstructed in the digital domain by the demodulator 306. The demodulator 306 may be implemented as part of a Digital Signal Processor (DSP).

The demodulation equation may be represented as follows:

$$v(t) = 2\frac{\alpha(t)}{T(t)} - 1 = \frac{\alpha(t) - \beta(t)}{\alpha(t) + \beta(t)} \quad (4)$$

Using the measurements obtained by the irregular sampler 304, the above equation may be approximated by:

$$\hat{v}[n] = \frac{\hat{\alpha}(n) - \hat{\beta}(n)}{\hat{\alpha}(n) + \hat{\beta}(n)} \quad (5)$$

Where $\alpha[n]$, $\beta[n]$ and $v[n]$ are estimates of $\alpha[nT_s]$, $\beta[nT_s]$ and $v[nT_s]$, with $f_c \geq f_s = 1/T_s \geq 2B$. In addition, $\alpha[n]$ and $\beta[n]$ may be measured values from the output of the TDC, (i.e., the sampled signal 404).

The sampled signal 404 represents the location of data edges, which are not synchronous with the reference clock 312 but are located at a variable time before the rising edge of the clock. Reconstructing $\alpha$ and $\beta$ directly from the sampled signal 404 provides estimates for $\alpha(t_\alpha)$ and $\beta(t_\beta)$, where $t_\alpha$ and $t_\beta$ are the actual positions of $\alpha$ and $\beta$, instead of the estimates for $\alpha[nT_s]$ and $\beta[nT_s]$. To obtain the estimates for $\alpha[n]$ and $\beta[n]$ for the reconstruction, the calculated values for $\alpha$ and $\beta$ via the sampled signal 404 are interpolated to $nT_s$ using cubic spline interpolation. Cubic spline interpolation is a form of interpolation well known in the art, where interpolants are special types of piecewise polynomials called splines. The interpolation error may be very small with cubic interpolators.

Figure 6:
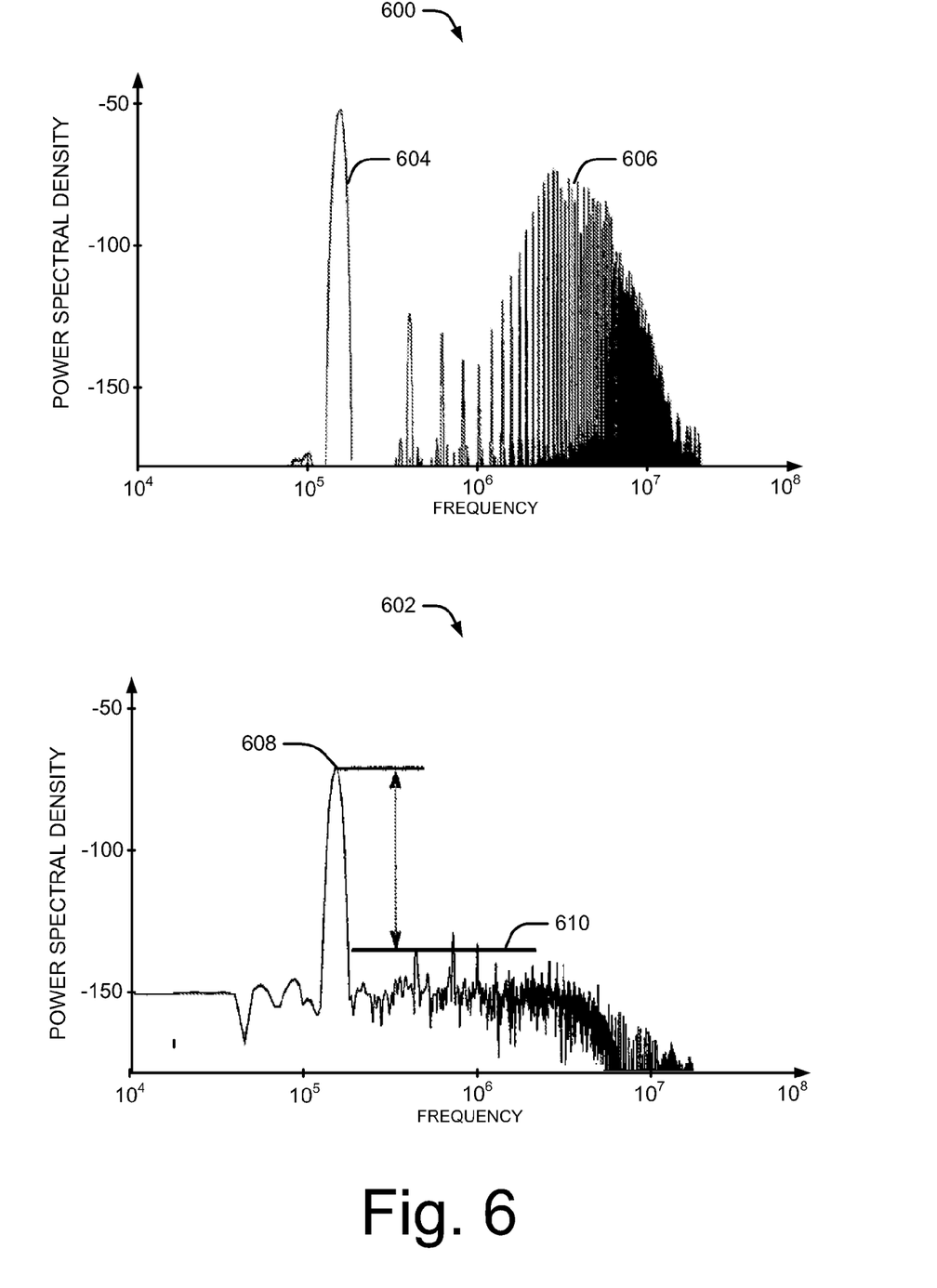
FIG. 6 illustrates power spectral density plots of an Asynchronous Delta Sigma Modulator (ADSM) and Time to Digital Converter (TDC) for an implementation of the ADSM and the TDC.

FIG. 6 illustrates exemplary Power Spectrum Density (PSD) plots 600 and 602 of the output of the ADSM 500 and the irregular sampler 304. In this example, the exemplary PSD plots 600 and 602 correspond to a 13-bit ADC with a signal bandwidth of 500 KHz, such as that used in typical Bluetooth baseband signals.

The PSD plot 600 of the ADSM 500 is depicted for the first order ADSM 500 including the integrator 502 and the comparator 506. The input signal may be a sine wave with a frequency of one-third the bandwidth. In this example, the modulation depth of the signal is 0.8. The PSD plot 600 of the ADSM 500 shows a fundamental signal 604 and the noise signal 606 that correspond to the modulated signal 402. The fundamental signal 604 is sufficiently separated from the noise signal 606 and has no quantization errors. This allows the use a low pass filter to remove the unwanted noise signal 606 and harmonic signals from the modulated signal 402.

The PSD plot 602 of the irregular sampler 304 implemented as a TDC shows a fundamental signal 608 and a noise floor 610. The quality of the irregular sampler 304 may be measured by its spurious-free dynamic range (SFDR) and signal to noise and distortion ratio (SNDR), which depend on separation between the fundamental signal 608 and the noise floor 610.

The SFDR is the usable dynamic range before spurious noise interferes or distorts the fundamental signal. SFDR is the measure of the difference in amplitudes between the fundamental signal and the largest harmonically or non-harmonically related spur from DC to full bandwidth. SFDR for any fundamental signal should be as large as possible so that the noise signal does not interfere with the useful signal too much. The following equation defines an proportional approximation of SFDR, where MD is modulation depth:

$$SFDR \propto \frac{F^2}{MD^2} \quad (6)$$

With $F = f_c/B$ defined as the ratio between $f_c$ and the signal bandwidth B. Therefore, as the signal bandwidth B and the modulation depth increases, the SFDR decreases, and the SFDR increases, with an increase in the limit cycle frequency $f_c$.

The signal to noise and distortion ratio SNDR of the TDC is defined by the following equation:

$$SNDR \propto \frac{MD^2}{FB^2 t_{unit}^2} \quad (7)$$

Where $t_{unit}=1/F_{ref}$. Therefore, for a given resolution and bandwidth, the SNDR decreases as the limit cycle frequency $f_c$ increases. In contrast, increasing the modulation depth increases the SNDR.

In an implementation, the modulation depth is limited to about 0.8, which may maximize the SNDR. In addition, the smaller $t_{unit}$ is, the larger the SNDR will be for the TDC. From the plot 602, it may be seen that the SNDR in the 0-500 KHz band (i.e., the in-band) is approximately 80 dB, while the SFDR in the in-band for the TDC output signal is approximately 80 dB as well. For example, a Bluetooth system may require a Signal to Noise and Distortion Ratio (SNDR) of at least 78 dB. Therefore, the irregular sampler 304 implemented as a TDC may be used in ultra-low voltage technologies such as a Bluetooth system.

Irregular Sampling with Noise Shaping

As described above, an irregular sampler may perform quantization of the sampled signal also. During quantization, the irregular sampler may introduce quantization noise into the circuit due to its finite precision. At high limit cycle frequencies, this may result in reduced SNDR of the system. To increase the SNDR of the system, noise-shaping techniques may be applied. For this, a feedback loop is introduced into the system, which shapes the quantization noise of the irregular sampler and quantizer to higher frequencies.

Noise shaping is a bit reduction technique that may be used to minimize the quantization error. Noise shaping introduces the quantization error in a feedback loop. Any feedback loop functions as a filter. Therefore, by creating a feedback loop for the error itself, the error may be filtered as desired.

During noise shaping, when any samples bit-depth is reduced, the quantization error between the rounded value and the original value is measured and stored. The error value is then added to the next sample prior to the quantization. The effect here is that the quantization error itself is put into the feedback loop. The cut-off frequency of the filter may be controlled by the amount of the error from the previous sample that is fed back.

Without noise shaping, the SNDR of the system may be reduced by about 10 dB/decade of F according to the equation:

$$SNDR \propto \frac{MD^2}{FB^2 t_{unit}^2} \quad (7)$$

However, noise shaping may increase the SNDR by 20 dB/decade with N (the order of the noise-shaping filter). Thus, for a system with $N^{th}$ order noise shaping, the SNDR may be defined by the following equation:

$$SNDR \propto \frac{MD^2 F^{2N-1}}{B^2 t_{unit}^2} \quad (8)$$

While a system without noise shaping may perform better when a low limit cycle frequency is chosen, a system with noise shaping benefits more from the increased performance when the limit cycle is high.

Figure 7:
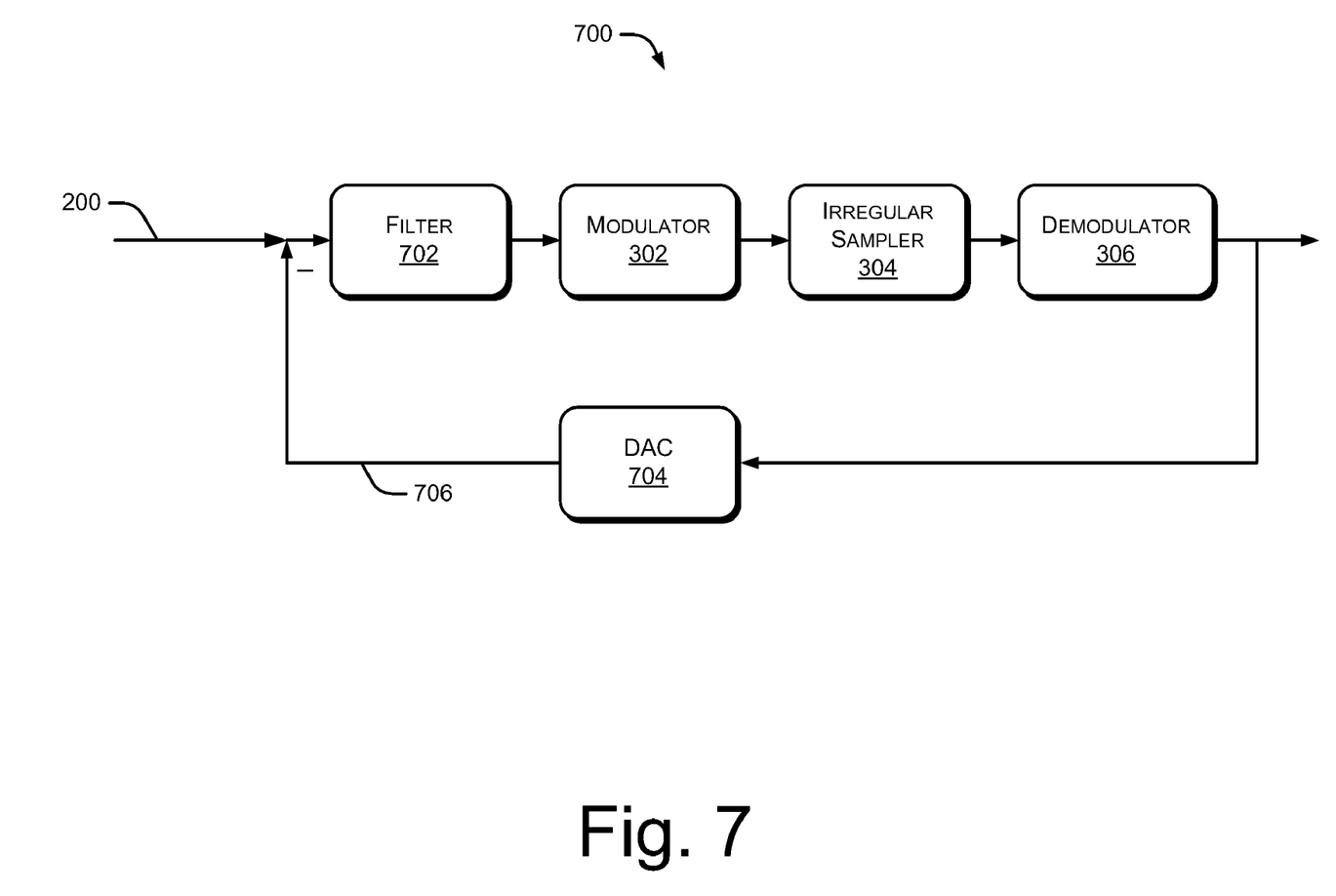
FIG. 7 illustrates an ADC using irregular sampling with noise shaping.

FIG. 7 illustrates an exemplary irregular sampling analog to digital converter (ADC) with noise shaping 700, referred to as ADC 700. It will be appreciated that the irregular sampler irregular sampling ADC with noise shaping may be a part of any electronic or communication device. In this example, the ADC 700 includes a digital filter 702, modulator 302, irregular sampler 304, demodulator 306, and a digital to analog converter 704 in a feedback loop.

An $N^{th}$ order noise-shaping filter 702 filters a signal obtained by combining the input signal 202 and a feedback signal 706. The digital filter 702 may be of any suitable order N, such as a second order noise shaper, a third order noise shaper, and so on. The digital filter 702 band limits the signal, and shapes the noise to a higher frequency, outside the bandwidth of the useful fundamental signal.

The output of the digital filter 702 is received by the modulator 302. In one implementation, the modulator 302 may be an ADSM, which converts the amplitude information of the analog signal into time information of the output asynchronous square wave signal.

This modulated signal from modulator 302 is received by the irregular sampler 304. In an implementation, the irregular sampler 304 may be a TDC, which generates time discrete irregular samples of the modulated signal. The TDC may over sample or hyper-sample the modulated signal in order to increase the SNDR and reduce quantization errors. In another embodiment, the TDC may generate regular or equidistant samples by introducing a reference clock in the TDC circuitry.

In another implementation, the irregular samples generated by the TDC may be quantized into discrete levels by the TDC itself. As discussed above, dithering may be introduced into the ADC 700 before quantization to reduce the distortion error and quantization error that may be introduced by the quantization process.

The irregular sampled and quantized output of the irregular sampler 304 is fed to the demodulator 306. In an implementation, the demodulator 306 may be present in a digital signal processing (DSP) unit. The demodulator 306 reconstructs the original signal. A part of this digital reconstruction of the original signal is converted to the analog feedback signal 706 with a multi-bit digital to analog converter (DAC) 704.

The DAC 704 introduced in the feed back path may be any suitable multi-bit DAC. The higher the number of bits of the DAC 704, the more precise it would be. Examples of DAC 704 may include pulse width modulation DAC, over sampling DAC, binary weighted DAC, segmented DAC and, so on.

Figure 8:
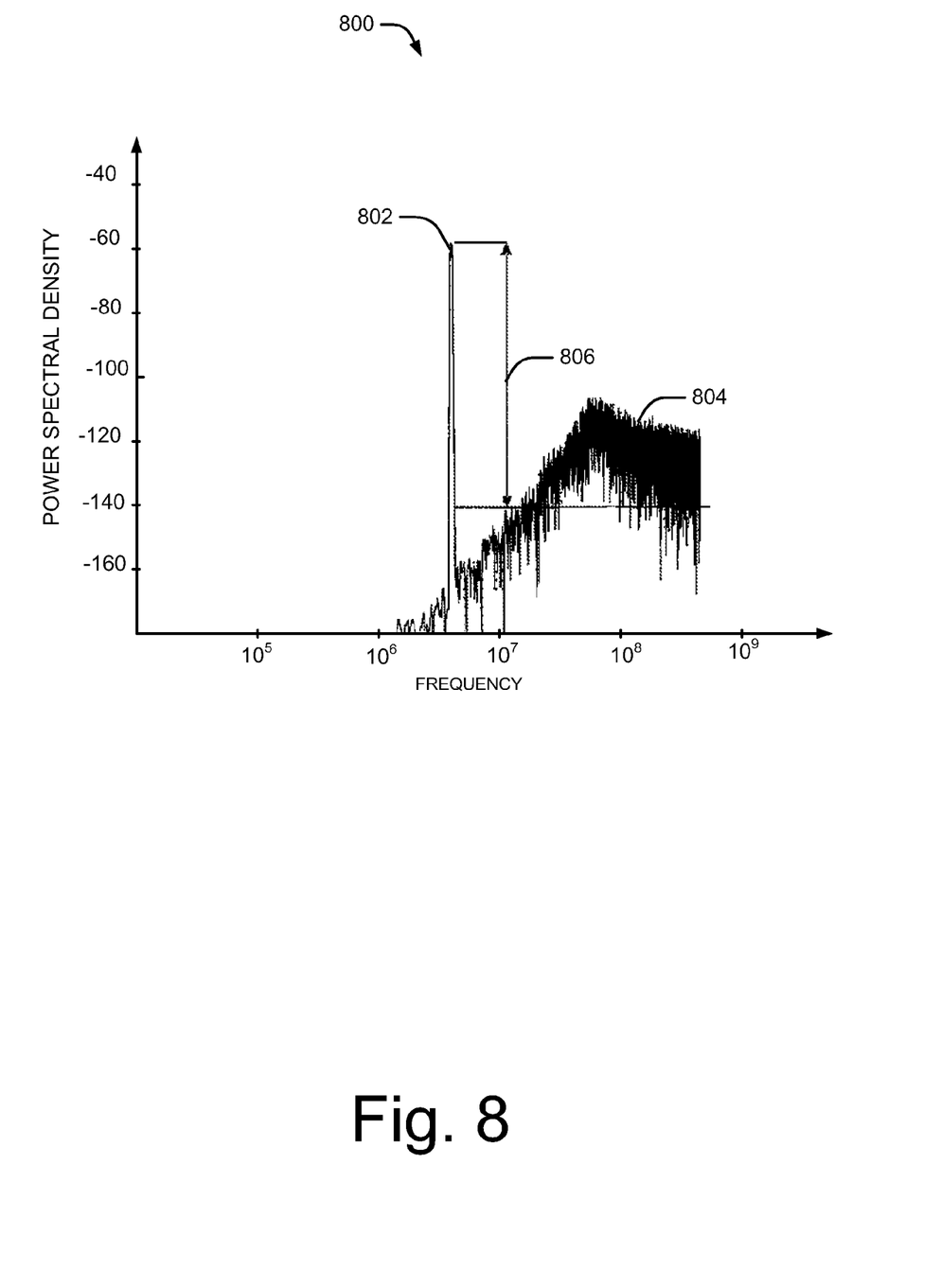
FIG. 8 illustrates a power spectral density plot of an ADC using a TDC with noise shaping for an implementation of the ADC.

FIG. 8 is an exemplary PSD plot 800 of the output of the ADC 700 with second order noise shaping. In this example, the PSD is plotted for the ADC 700 with a bandwidth requirement of 12 MHz, suitable for Very high speed Digital Subscriber Line (VDSL). A first order feedback is used to shape the quantization noise of the TDC. The time resolution is 10 ps and the modulation depth is 0.5. For this configuration, 12 bit accuracy is obtained over the 12 MHz bandwidth with a limit cycle frequency of 750 MHz.

The PSD plot 800 shows a fundamental signal 802 and quantization noise 804. The quantization noise 804 has been shifted to higher frequencies by noise shaping as depicted in the plot 800. The difference between the fundamental signal amplitude and the noise amplitude is approximately 72 dB, which is the SNDR. The SFDR 806 of the depicted system is approximately 82 dB.

Exemplary Methods

Figure 9:
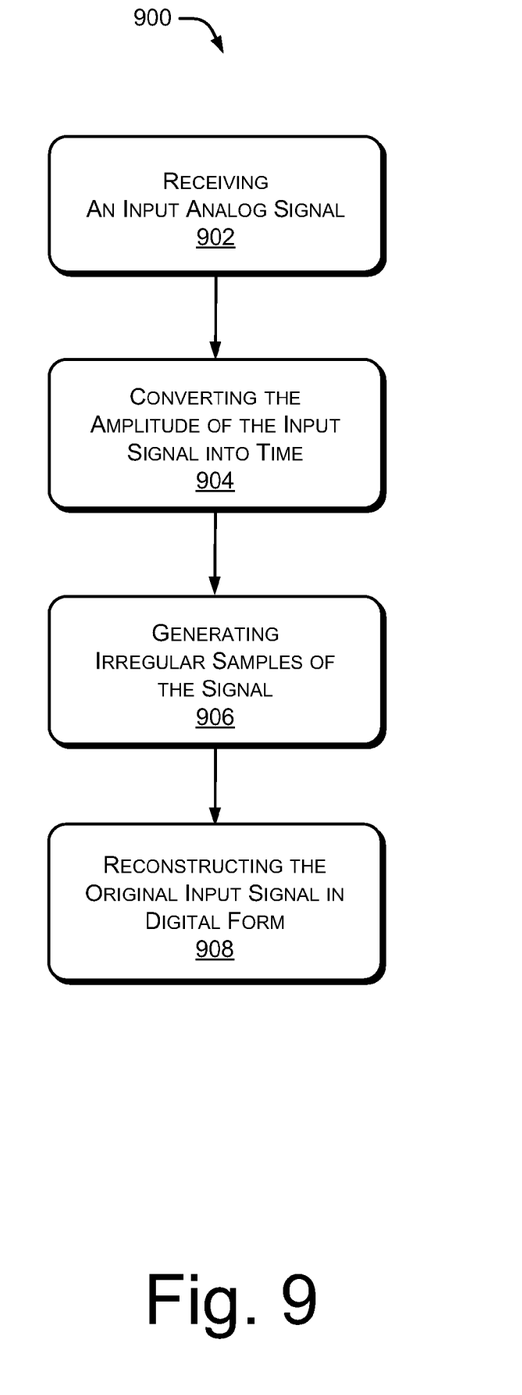
FIG. 9 illustrates a flow diagram for implementing analog to digital conversion using irregular sampling.

FIG. 9 illustrates an exemplary method for analog to digital conversion using irregular sampling and is described with reference to FIGS. 2-6. The order in which the method is described is not intended to be construed as a limitation, and any number of the described method blocks may be combined in any order to implement the method, or alternate method.

Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 902, an analog input signal is received. As discussed above, an example of such an input analog signal is the analog input signal 202 which may be received by the modulator 302. The received analog input signal 202 may be a band-limited signal. In an implementation, if the signal is not band limited, pre-filtering may band limit the signal and minimize interference noise in the analog signal. Furthermore, the analog input signal 202 may be amplified, if the signal is weak, before further processing.

At block 904, amplitude to the received band limited analog input signal is converted to time. In an implementation, the band limited analog input signal 202 may be modulated using the modulator 302, which may be the ADSM 500. The ADSM 500 may convert the amplitude information of the analog input signal 202 into time information of the modulated signal 402 using duty cycle modulation or pulse modulation. As a result, variations in the amplitude of the analog input signal 202 are converted into variations of the pulse width 510 and pulse period 514 of the modulated signal 402. The output of the modulator 302 may be an asynchronous time continuous square wave.

At block 906, irregular samples of the modulated signal are generated. In an implementation, irregular samples of the modulated signal 402 may be generated. A TDC may be used as the irregular sampler 304 for sampling the modulated signal 402. The TDC measures the location of data edges of the modulated signal 402 and produces an irregular sampled output 404 indicating the location of the data edges of the modulated signal 402.

In addition, the irregular sampler 304 may also generate the equidistant sampled signal 408 by sampling the signal at regular intervals of time. This may be achieved by introducing the reference clock $F_{ref}$ 312 in the TDC that measures the variation in data edges at regular intervals of time.

In certain cases, the irregularly sampled signal 404 may be quantized by the TDC. The quantization of the samples may introduce a quantization error due to the finite precision of the TDC. Dithering may be introduced before the quantization of the sampled signal to randomize the quantization noise. Examples of dithers that may be used include rectangle probability density function, triangular probability density function, Gaussian PDF, etc.

At block 908, the original signal may be reconstructed in digital form to generate a digital signal. In an implementation, The demodulator 306) may be used to reconstruct the digital signal 308 sample by sample. The demodulator 306 may use techniques derived from duty-cycle modulation theory described above. This technique may allow reconstruction of the original signal without ultra high-speed operations.

Figure 10:
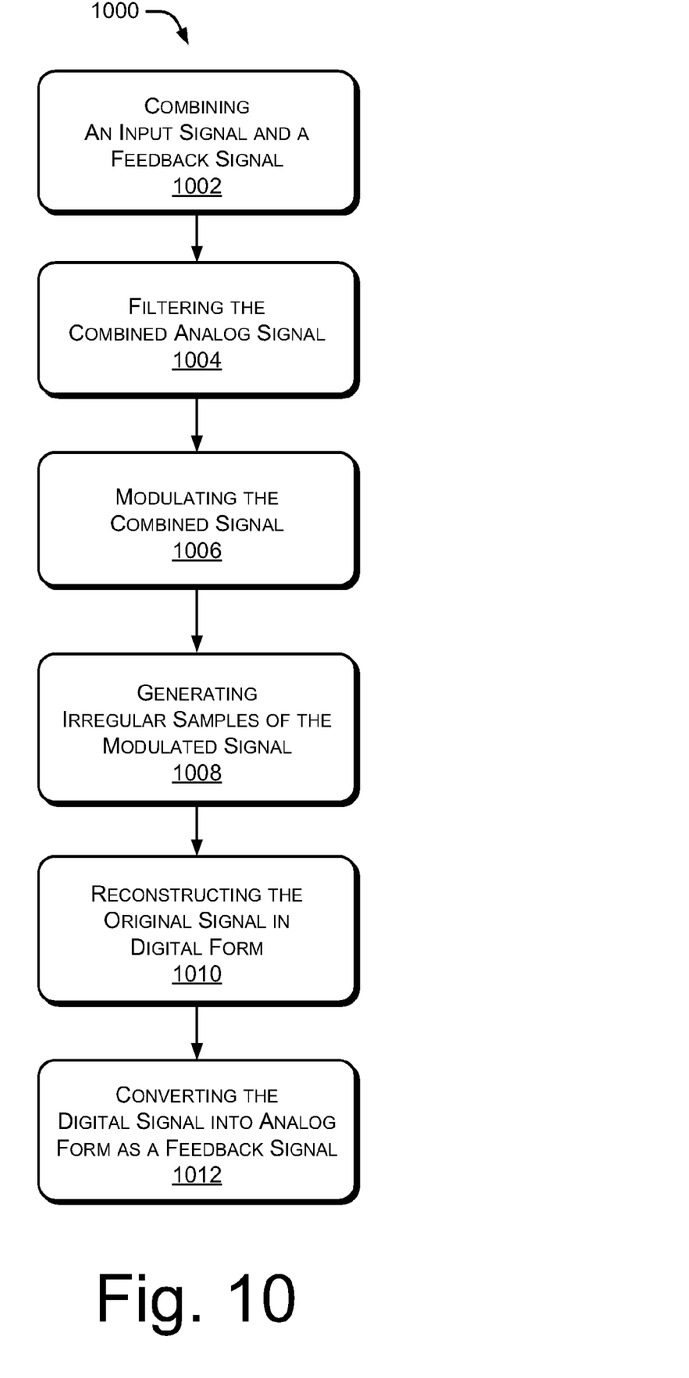
FIG. 10 illustrates a flow diagram for implementing analog to digital conversion using irregular sampling with noise shaping.

FIG. 10 illustrates an exemplary method 1000 for analog to digital conversion using irregular sampling with noise shaping and is described with reference to FIGS. 7-8. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 1002, an analog input signal is combined with a feedback signal and is sent to a digital filter. In an implementation, the input analog signal 202 is combined with the feedback signal 704 and sent to the digital filter 702. The analog input signal may be band limited. In cases where the analog input signal is not band limited, a pre-filtering low pass filter may be introduced to limit the analog input signal and remove higher harmonics and noise. The feedback signal 706 may be obtained from the reconstructed digital signal 308) that may include quantization noise.

At block 1004, the combined signal is filtered. In an implementation, filtering may be performed using the digital noise-shaping filter 702. The quantization noise may be shaped to a higher frequency part of the spectrum so that the quantization does not interfere with the analog input signal 202. The noise-shaping filter may be of any suitable order such as first order noise shaper, second order noise shaper, and so on.

At block 1006, the combined noise shaped signal may be modulated. In an implementation, the combined noise shaped signal may be modulated by the modulator 302, which may be implemented by the ADSM 500. The ADSM 500 converts the amplitude information of the combined signal into time information of the modulated signal. The ADSM 500 uses pulse modulation to obtain an output that varies in pulse width and pulse period in accordance with the variation of the amplitude of the combined signal.

At block 1008, samples of the combined modulated signal are generated. In particular, the combined modulated signal is sampled irregularly to obtain non-equidistant samples. In an implementation, the irregular sampler 304 may sample the combined modulated signal irregularly to obtain the non-equidistant samples. A TDC may also be used to sample the signal. The TDC samples the signal whenever there is a data transition. The edges of the modulated signal are digitally measured and the TDC generates the digital sampled signal 404 that represents the location of the data edges of the modulated signal 402.

Furthermore, the TDC may generate equidistant or regular samples by sampling the modulated signal at regular intervals of time. The TDC may include a reference clock that functions at least at the limit cycle frequency to avoid losing any information. The reference clock may function at a frequency much higher than the limit frequency, which would over sample or hyper-sample the modulated signal thereby increasing the SNDR of the TDC.

In addition, the sampled signal 404 may also be quantized by the TDC. The quantized signal may introduce a quantization error into the quantized signal as the TDC operates at a finite resolution. The quantization error may be lowered by increasing the resolution of the TDC. Dithering may be introduced before the quantization to randomize the quantization noise.

At block 1010, the sampled and quantized signal may be used to reconstruct the original signal in digital form. The reconstruction is carried out sample by sample and may be performed at a reasonable clock frequency. In an implementation, the demodulator 306 may be used to reconstruct the original signal using the duty-cycle modulation theory as discussed above. In certain implementation the demodulator 306 may be part of a Digital Signal Processor.

At block 1012, a part of the reconstructed digital signal is converted back into an analog signal. In an implementation, the converting may be performed by the digital to analog converter, DAC 706. The converted signal may used as the feedback signal 706, in order to shape the quantization noise introduced by the TDC.

Exemplary Electronic Device

Figure 11:
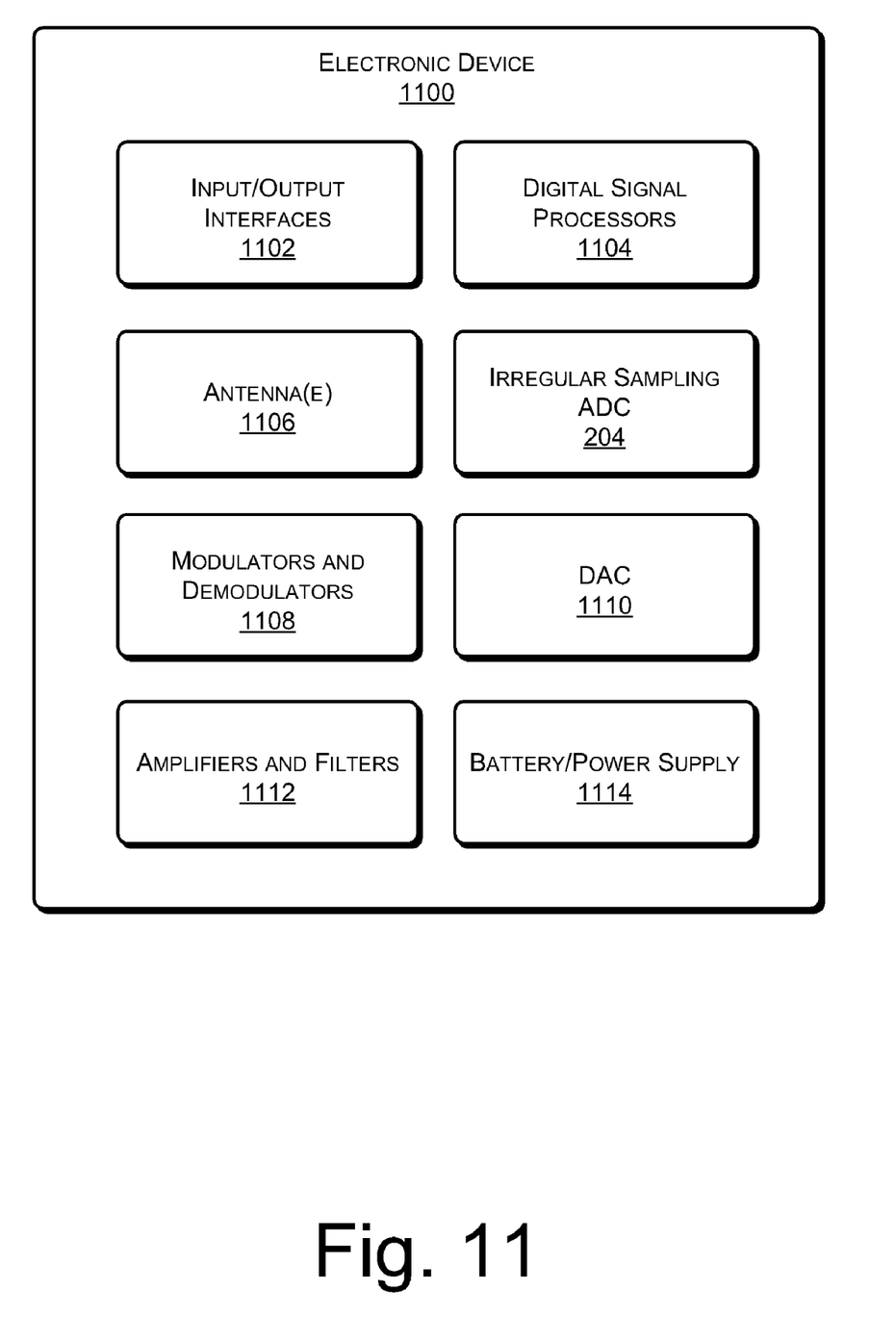
FIG. 11 illustrates an electronic device implementing an ADC using irregular sampling.

FIG. 11 illustrates an embodiment of an electronic device 1100 implementing analog to digital conversion using irregular sampling. The electronic device 1100 may include one or more input/output interfaces 1102 and Digital Signal processor(s) DSP 1104. The electronic device 1100 may further include one or more antennae 1106 for transmitting and receiving radio frequency. The antennae 1106 may be configured to received different radio frequencies (RF) in different bands. The antenna 1106 may include smart antennas, fractal antennas, microstrip antenna, and so on.

The one or more digital signal processors 1104 may perform control and command functions, including accessing and controlling the components of the electronic device 1100. Digital Signal Processor(s) 1104 may be a single processing unit or multiple computing units. Input/output interfaces 1102 may be used to connect input/output devices such as such as a microphone, a user screen, a user interface (e.g., keypad, touchpad, etc.), speakers, and so on to the electronic device 1100.

The electronic device 1100 includes the irregular sampling analog to digital converter 204 that may convert input analog signals received via the input/output interfaces 1102 into digital signal. The irregular sampling analog to digital converter 204 may include the modulator 302, the irregular sampler and quantizer 304 and the demodulator 306.

The analog signal may be first modulated to generate asynchronous square waves with varying pulse width and period in accordance with the amplitude of the analog signal. This modulated signal is then sampled to generate irregular samples. The sampled signal may be quantized before it is utilized to reconstruct the original signal sample by sample in digital form or a digital signal.

Modulators and demodulators 1108 may be included in the electronic device 1100 in order to up sample the digital signal or add a carrier wave to the digital signal for broadband transmission. In an implementation, a demodulator may demodulate the signal received via the antenna, and strip off the carried frequency to obtain the baseband digital signal.

The baseband digital signal may be converted into analog. Converting to analog may be performed using a Digital to Analog Converter 1110 or DAC 1110. Any suitable DAC 1110 may be used in the electronic device 1100. For example, Binary weighted DAC, over sampling DAC, pulse width modulating DAC, segmented DAC, and so on. The choice of the DAC 1110 may depend on the technology used, the frequency of the signal, the precision and accuracy demanded and so on.

Amplifiers and filters 1112 may also be present in the electronic device 1100 to amplify the signal and minimize the noise and distortion of the signal in the useful band. The amplifiers may be power amplifiers, operational amplifiers, and audio amplifiers and so on. The filters in the electronic device 1100 may include pre filters, noise shapers, digital filters, analog filters and so on. The electronic device 1100 also includes a battery or power supply 1114 that provides power to the electronic device.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. An apparatus comprising:
    an Analog to Digital Converter (ADC) that converts an analog signal into a digital signal, comprised of:
    (a) an Asynchronous Delta Sigma Modulator (ADSM) that generates an asynchronous square wave which is approximately linearly dependent on the analog signal; and
    (b) a Time to Digital Converter (TDC) that measures edges of the asynchronous square wave to generate samples of the digital signal; and
    (c) a digital modulator that modulates the digital signal.

2. The apparatus of claim 1, wherein the ADSM generates the asynchronous square wave with a duty cycle varying linearly in accordance with the amplitude of the analog signal.

3. The apparatus of claim 1, wherein the TDC operates as a high speed sampler sampling the asynchronous square wave as an input signal during data transmission.

4. The apparatus of claim 1, wherein the digital modulator up samples the digital signal.

5. The apparatus of claim 1, wherein the digital modulator introduces a carrier for broadband transmission.

6. An Analog to Digital Converter (ADC) comprising:
    an Asynchronous Delta Sigma Modulator (ADSM) that modulates a received analog signal to a continuous time asynchronous square wave;
    a Time to Digital Converter (TDC) that samples the continuous time asynchronous square wave; and
    a demodulator that reconstructs the analog signal in time domain, from the samples provided by the TDC.

7. The ADC of claim 6, wherein the ADSM modulates the received analog signal to the continuous time asynchronous square wave, through duty cycle modulation.

8. The ADC of claim 6, wherein the ADSM includes an integrator and a comparator, wherein the integrator integrates a difference between the received analog signal and a feedback signal, through a feedback loop, and output from the integrator is received by the comparator.

9. The ADC of claim 6, wherein the continuous time asynchronous square wave is a signal modulated by the ADSM, wherein the modulated signal includes variations in pulse width, pulse distance, and pulse period.

10. The ADC of claim 6, wherein the TDC samples the continuous time asynchronous square wave with multiple phases of a reference clock.

11. The ADC of claim 10 further comprising an edge detector that determines which phase passes closest to a data edge of the asynchronous square wave.

12. The ADC of claim 6, wherein the TDC implements an interpolator to further refine sampling of the continuous time asynchronous square wave.

13. The ADC of claim 6, wherein the demodulator reconstructs the analog signal based on a cubic spline interpolation.

* * * * *

UNITED STATES PATENT AND TRADEMARK OFFICE
CERTIFICATE OF CORRECTION

| | | |
|---|---|---|
| PATENT NO. | : 7,859,442 B2 | Page 1 of 1 |
| APPLICATION NO. | : 12/245221 | |
| DATED | : December 28, 2010 | |
| INVENTOR(S) | : Jorg Daniels | |

It is certified that error appears in the above-identified patent and that said Letters Patent is hereby corrected as shown below:

On the Title Page, Item (60), please change "Provisional application No. 60/977,880, filed on Oct. 5, 2007" to --Provisional Application No. 60/977,910, filed on Oct. 5, 2007--

Signed and Sealed this
Twenty-ninth Day of May, 2012

David J. Kappos
*Director of the United States Patent and Trademark Office*